United States Patent [19]
Gieck et al.

[11] 3,980,966
[45] Sept. 14, 1976

[54] CIRCUIT ARRANGEMENT FOR THE RECEIVING OF BINARY DIRECT CURRENT SIGNALS WHICH ARE TRANSMITTED WITH LOW TRANSMISSION VOLTAGE OVER GALVANICALLY CONNECTED LINES

[75] Inventors: Reiner Gieck, Munich; Karl-Georg Dieter, Konigsdorf Zellwies, both of Germany

[73] Assignee: Siemens Aktiengesellschaft, Munich, Germany

[22] Filed: Mar. 5, 1973

[21] Appl. No.: 338,025

Related U.S. Application Data
[63] Continuation of Ser. No. 76,429, Sept. 29, 1970, abandoned.

[52] U.S. Cl. ................................. 330/69; 330/103; 330/112
[51] Int. Cl.² ........................................ H03F 3/45
[58] Field of Search ............................ 330/69, 30 D

[56] References Cited
UNITED STATES PATENTS

| | | | |
|---|---|---|---|
| 3,500,223 | 3/1970 | Thurnell | 330/30 D |
| 3,530,395 | 9/1970 | Prusha | 330/69 |

Primary Examiner—James B. Mullins
Attorney, Agent, or Firm—Gerald L. Lett

[57] ABSTRACT

A circuit for receiving low transmission voltage, direct current data signals is described. The circuit operates to form the received signal into two voltages which are symmetrical with respect to ground, and the latter two voltages are coupled to the inputs of a difference amplifier. The amplifier comprises two, oppositely-phased outputs which are coupled to different ones of the inputs. An amplified differential signal is produced at a third output terminal.

4 Claims, 3 Drawing Figures

CIRCUIT ARRANGEMENT FOR THE RECEIVING OF BINARY DIRECT CURRENT SIGNALS WHICH ARE TRANSMITTED WITH LOW TRANSMISSION VOLTAGE OVER GALVANICALLY CONNECTED LINES

BACKGROUND OF THE INVENTION

This is a continuation of application Ser. No. 76,429, filed Sept. 29, 1970, and now abandoned.

The object of the invention is a circuit arrangement for the receiving and regenerating of binary direct current signals which are transmitted over low transmission voltage electrically connected lines.

The use of direct current telegraphy for data transmission is known. Thereby high line currents and transmission voltages are used, for example neutral current 40 mA at 120 V, or polar current ± 20 mA at 60 V transmission voltage. The transmission speed of this known system is, however, limited at 200 Bd.

A direct current data transmission system is already known which makes possible a low distortion transmission, insensitive to distortion voltages, with step speeds of up to 4800 Bd over electrically through-connected lines see for example (German Pat. No. 1,251,798). This direct current data transmission system operates with a transmission voltage lying below ± 0.5 V.

For the reception of this low voltage a highly-sensitive amplifier is required which regenerates the different binary direct current signals into rectangular-shaped data signals and differentiates the data signals from disturbance voltages with sufficient reliability. For reasons of disturbance reliability such receiving circuits possess a hysteresis. This means that the amplifier reaches saturation only upon exceeding of a specific positive voltage value and emits a first outlet signal. This first outlet signal is emitted until the received signals goes below a specific negative voltage value. Now another stage of the amplifier reaches saturation and at the outlet a second outlet signal originates. The second signal is emitted until the input signal exceeds the positive voltage value. The amplifier only emits the two voltage values at the outlet, depending on the exceeding of the upper and the undershooting of the lower voltage threshold. The realization of such a receiving circuit is difficult and subject to high costs. Usually three stages, i.e. a high gain inlet amplifier, a stage which possesses a double-sided hysteresis effect, and a subsequent amplifier which makes possible the matching to the subsequently connected evaluation circuit, are necessary.

It is an object of the invention to provide a receiving circuit which satisfies the above-said provisions and makes possible a simple, economic apparatus.

SUMMARY OF THE INVENTION

The invention achieves this object through the fact that from the receiving signals two voltages symmetrical with respect to ground are formed, and that the two voltages lie at the inlets of the difference amplifier of an operation amplifier. The operation amplifier possesses two opposite-phase outlets, the outlet voltages whereof are fed back over resistors to the associated inlets of the difference amplifier, and that at the difference signal outlet of the operation amplifier the regenerated binary data signal results.

The invention possesses the advantage that a very inexpensive to construct apparatus with a low number of components is provided. Thereby integrated component stages which are commercially available at a favorable price are used. The receiving circuit possesses a signal active component, i.e. an operation amplifier, possessing a high amplification and low drift. The two voltage thresholds can be set in simple manner, without thereby changing the circuit symmetry. In the case of a transmission voltage of for example ± 0.4 V the receiving circuit is able to process a receiving voltage of ± 0.04V to ± 0.4 V. For reasons of disturbance reliability the voltage value 0 V is neither transmitted nor evaluated. The circuit possesses a great insensitivity to disturbances and makes possible the receiving of data signals which are transmitted at the highest transmission speeds, for example 4800 Bd. The inlet resistance of the receiving circuit is low. The receiving circuit can be placed on neutral in simple manner, i.e. upon receiving of 1 : 1 changes of the binary direct current voltage signal no one-sided distortion results. A one-sided distortion results in a case when the direct current signals are not scanned in the center of the pulse edges. The receiving circuit regenerates the data signals in to rectangular-shaped signals, whereby over a great temperature range excellent results are guaranteed. A diode network at the outlet of the operation amplifier takes care of equal ascent- and descent-edges of the direct current signals and thereby saves further active components.

BRIEF DESCRIPTION OF THE DRAWINGS

Details of the invention are explained with the aid of an advantageous working example which is shown in the drawings.

DETAILED DESCRIPTION OF THE DRAWINGS

A basic principle of the invention lies in the use of an operation amplifier for the receiving of the low direct current voltage signals and changing them in simple manner in such a way that the conditions required for receivers of this type, i.e. high amplification, disturbance reliability, hysteresis, temperature constancy and low drift are fulfilled. The operation amplifier possesses a difference amplifier at the inlet and an emitter follower stage at the outlet. From the interior of the operation amplifier additionally two connections are conducted towards the exterior, at which the amplified versions of th input signals can be taken off. Such operation amplifiers can be bought commercially at favorable costs, as integrated component stages. From the two opposite-phase outlets — over resistors — positive feedback is effected to the inlet terminals and thereby the hysteresis set.

Figure 1:
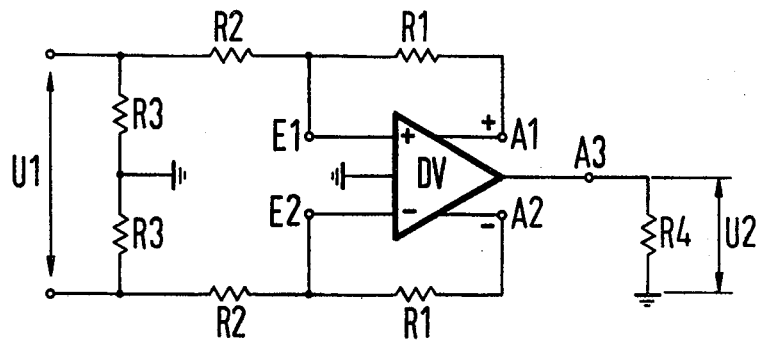
FIG. 1 is a schematic diagram of a preferred embodiment of the inventive receiving circuit.

FIG. 1 shows a preferred embodiment of the inventive receiving circuit. Operation amplifier DV possesses two inlet terminals E1 and E2 at which — balanced to ground — the inlet signal appears. At the two outlet terminals A1 and A2 the opposite-phase signals appears. The difference signal of the operation amplifier appears at outlet A3. At load resistor R4 results the regenerated binary direct current voltage signal U2, which is forwarded to an evaluation circuit. Outlets A1 and A2 are coupled back in each case over resistors R1, which both possess the same resistance value. Received signal U1 appear across a resistance network consisting of resistors R2 and R3. The resistors with the same designations possess equal resistance values, so that a symmetrical signal formation is guaranteed. At inlet terminals E1 and E2 there results two equally large symmetrical grounded voltages. Through the selection of resistors R1 and R2 it is possible to set the lower and the upper response thresholds for the hysteresis effect. If the operation amplifier DV is operated without feedback (R1 = ), a low inlet voltage U1 is sufficient to place the amplifier into saturation. At outlet A1 there then lies voltage +Us and at outlet A2, due to the opposite phase condition voltage − Us. Provided that the amplitude, when running without load is very high, (in operation amplifiers the amplification is about 1,000) one can effect with the aid of resistors R1 and R2 that at outlet terminals A1 and A2 voltage Us is attained only after the inlet voltage U1 has exceeded a predetermined voltage value. This voltage value is called hysteresis voltage $U_H$.

The hysteresis voltage is comprised of the two response voltage values $U_{H1}$ and $U_{H2}$ and is of the following magnitude:

$$U_H = U_{H1} + U_{H2} = 2Us \cdot R2/R1 + 2 \cdot - Us \cdot R2/R1$$

$U_{H1}$ thereby signifies the response threshold in the positive direction, caused by a feed-back branch and $U_{H2}$ accordingly the response threshold in the negative direction of inlet signal U1.

If amplifier outlets A1 and A2 were completely equal, the switching would have to take place symmetrically to the center of inlet signal U1, as then $U_{H1} = U_{H2}$. In the practical circuit however, due to the difference in outlets A1 and A2 voltages $U_{H1}$ and $U_{H2}$ are not equal. However, the equality of these threshold voltages is a prerequisite to a transmission with a minimum of distortions and must therefore be forced. This process is called "setting on neutral".

There are two possibilities in this connection:

One possibility provides that one of the two resistors R2 is replaced by a control resistor. With the control resistor either $U_{H1}$ or $U_{H2}$ — depending on the branch into which the control resistor is switched — can be changed by itself. The control resistance is changed until the changeable threshold is equal in magnitude to the permanent threshold. This solution is unsatisfactory due to the fact that thereby the symmetry of the inlet circuit of the operation amplifier does not remain intact.

Figure 2:
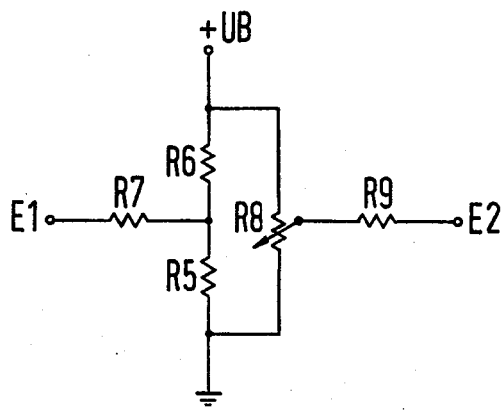
FIG. 2 is a schematic diagram of a preferred embodiment of a resistance network which makes possible a simple setting to neutral of the receiving circuit.

The other possibility of setting to neutral wherein the symmetry of the inlet circuit of the operation amplifier DV remains intact is shown in FIG. 2. The resistance network is connected to the inlet terminals E1 and E2 of operation amplifier DV. The two inlets E1 and E2 obtain from the outside over a voltage divider consisting of resistors R5, R6, R7, R8 and R9, the same direct current voltage potential which is derived from direct current voltage source +UB. The operation amplifier then operates the same as before, as the difference amplifier at the inlet subtracts these potentials from one another. Only if one auxiliary potential differs from the other a change occurs. The two switching thresholds are shifted relative to the signal. The sum of partial voltages $U_{H1} + U_{H2}$ however remains constant. Now over the control resistor that condition is set wherein $U_{H1} = U_{H2}$. Hereby the symmetry of the inlet circuit remains intact, even if the neutral position range must be selected largely by reason of sample scattering.

Figure 3:
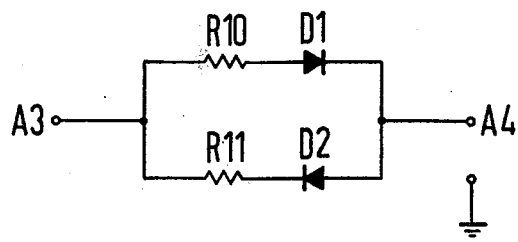
FIG. 3 is a schematic diagram of a preferred embodiment of an additional diode network for the receiving circuit.

FIG. 3 shows a diode network which is connected to the outlet A3 of the operation amplifier. Upon the loading of the operation amplifier with a real termination resistor, the distortion of the regenerated direct current signals remains independent of the magnitude of the inlet voltage. If, however, in the load resistor for example an inductive or capacitive component appears, the output of the emitter succession stage of the operation amplifier becomes noticeable. Due to the resistance of different magnitude of the emitter follower stage in the conducting and blocked condition different discharge resistance result at the leading and trailing pulse edges. Thereby the ascending and descending edges of the direct current signals become unequal and the distortion changes with magnitude of the receiving voltage. With a diode network which is connected to the outlet terminals A3 of the operation amplifier the two edges of the signals obtain the same steepness.

The diode network consists of resistors R10 and R11 as well as diodes D1 and D2. At outlet terminal A4 as a result the regenerated direct current voltage signals are provided, the ascent- and descent edges of which are equal. Each of the two diodes D1 and D2 only permits one polarity of the step flanks to pass through, so that through the different resistors R10 and R11 the equality of the rise and fall time constant of the pulse edges is achieved. With an appropriate dimensioning one diode can be eliminated. For reasons of the parallel course of the temperature of both flanks it is favorable, however, to connect two diodes. At the same time sample scatterings of the operation amplifiers are equalized. The value for resistors R10 and R11 are selected in such a way that for different operation amplifiers a good transmission behavior, i.e. little distortion, comes about. The receiving circuit is generally suited for the regeneration of binary direct current voltage signals.

The preferred embodiments of the invention described hereinabove are only exemplary, and it is contemplated that a variety of changes and modifications may be made to these described embodiments within the scope of the appended claims.

We claim:

1. A circuit arrangement for receiving low voltage level direct current binary data signals having interfering voltages superimposed thereon and for regenerating therefrom pulse-shaped binary data signals comprising:

input terminals, operational amplifier means having first and second inputs and first and second outputs which deliver, respectively, amplified versions of signals coupled to said first and second inputs and including a third output for delivering a binary output signal, relative to a reference value, having a value proportional to the difference between the values of signals applied to said first and second inputs, first feedback means including a series connected first impedance connecting said first output to said first input of said operational amplifier means for providing positive feedback, second feedback means including a series connected second impedance connecting said second output to said second input of said operational amplifier means for providing positive feedback and first and second voltage dividers each comprising, respectively, third and fourth impedances, said first voltage divider having said third impedance therein connected to a first of said input terminals and to said reference value and having said fourth impedance therein connected to said first of said input terminals and to said first input of said operational amplifier means, said second voltage divider having said third impedance therein connected to a second of said input terminals and to said reference value and having said fourth impedance therein connected to said second of said input terminals and to said second input of said operational amplifier means.

2. The circuit arrangement defined in claim 1 further comprising a neutralizing circuit means for equalizing the threshold voltages applied to said pair of operational amplifier inputs, said neutralizing circuit means comprising a direct current voltage source coupled over first and second resistive paths to said first and second operational amplifier inputs, one of said paths including a variable voltage divider which is resistance coupled between said direct current voltage source and one of said operational amplifier inputs.

3. The circuit arrangement defined in claim 1 further comprising an output load device and a diode network coupled between said third operational amplifier output and said output device, said network including first and second parallel resistance paths, at least one of said paths including diode means for permitting only one polarity of said regenerated binary signal to pass through said path, whereby said operational amplifier means is effectively isolated from said output load device.

4. The circuit arrangement defined in claim 3 wherein each of said parallel paths includes diode means for permitting only one polarity of said regenerated binary signal to pass through, said paths including resistive components sized to equalize the rise and fall time constance of the pulse edges of said regenerated signal.

* * * * *